(12) United States Patent
Higashi et al.

(10) Patent No.: US 11,005,471 B2
(45) Date of Patent: May 11, 2021

(54) SIGNAL GENERATING CIRCUIT AND POWER SUPPLY DEVICE

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Makoto Higashi, Mie (JP); Takenori Abe, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 235 days.

(21) Appl. No.: 16/338,102

(22) PCT Filed: Sep. 12, 2017

(86) PCT No.: PCT/JP2017/032891
§ 371 (c)(1),
(2) Date: Mar. 29, 2019

(87) PCT Pub. No.: WO2018/061749
PCT Pub. Date: Apr. 5, 2018

(65) Prior Publication Data
US 2020/0127654 A1    Apr. 23, 2020

(30) Foreign Application Priority Data
Sep. 30, 2016   (JP) .............................. JP2016-194130

(51) Int. Cl.
*H03K 7/08*    (2006.01)
*H02M 3/155*   (2006.01)
*H02M 7/5387*  (2007.01)

(52) U.S. Cl.
CPC .............. *H03K 7/08* (2013.01); *H02M 3/155* (2013.01); *H02M 7/5387* (2013.01)

(58) Field of Classification Search
CPC ....... H03K 7/08; H02M 3/155; H02M 7/5387
USPC .......................................................... 332/109
See application file for complete search history.

(56) References Cited

FOREIGN PATENT DOCUMENTS

| JP | H1-136572    | 5/1989 |
|----|--------------|--------|
| JP | H03-098470 A | 4/1991 |
| JP | H5-087447 A  | 4/1993 |
| JP | 2000-184729 A| 6/2000 |

(Continued)

OTHER PUBLICATIONS

International Search Report, Application No. PCT/JP2017/032891, dated Oct. 24, 2017.

*Primary Examiner* — Richard Tan
(74) *Attorney, Agent, or Firm* — Honigman LLP

(57) ABSTRACT

A cycle setting unit of a signal generating circuit varies a set cycle value. A first determining unit determines a first ON time on the basis of: a first duty ratio obtained by correcting, with a correction value, a ratio between a target ON time and a reference cycle; and a set cycle value. A second determining unit determines, as a second ON time, a setting candidate value that is close to the first ON time. A generating unit generates a PWM signal reflecting the set cycle value and the second ON time. A third determining unit determines the correction value that is to be used next time by the first determining unit, on the basis of the target ON time, the reference cycle, the correction value of the previous time, the set cycle value, and the second ON time.

6 Claims, 4 Drawing Sheets

(56) References Cited

FOREIGN PATENT DOCUMENTS

| | | |
|---|---|---|
| JP | 2004-266930 A | 9/2004 |
| JP | 2010-130850 A | 6/2010 |

Legend
A= Amount of operation

SIGNAL GENERATING CIRCUIT AND POWER SUPPLY DEVICE

CROSS-REFERENCE TO RELATED APPLICATIONS

This application is the U.S. national stage of PCT/JP2017/032891 filed Sep. 12, 2017, which claims priority of Japanese Patent Application No. JP 2016-194130 filed Sep. 30, 2016, the contents of which are incorporated herein.

TECHNICAL FIELD

The present disclosure relates to a signal generating circuit and a power supply device.

BACKGROUND

Voltage converting devices that convert voltage by driving switching elements with PWM (pulse width modulation) signals are conventionally widely used. For example, such a PWM-controlled voltage converting device calculates a voltage command value on the basis of a target voltage value and then sets the value corresponding to the calculated command value in a PWM signal generating unit. With this, the PWM-controlled voltage converting device generates a PWM signal having a duty ratio corresponding to the set value. Varying the duty ratio of the PWM signal used for driving the switching element according to the target voltage value in this way can provide an output voltage corresponding to the target voltage value.

Here, when a minimum unit of a value settable in the PWM signal generating unit (that is, a minimum increment) is relatively large, the duty ratio of the PWM signal cannot vary smoothly with respect to variations in the target voltage value. More specifically, the output voltage varies stepwise. For example, suppose that a target value to be set in the PWM signal generating unit is calculated as the amount of PWM control. In this case, when a minimum unit of the target value is larger than the settable minimum unit, the duty ratio of the PWM signal cannot vary smoothly with respect to the variations in the target voltage value and to load fluctuation. This causes an error to the output voltage.

To address these circumstances, Japanese Unexamined Application Publication No. 3-98470 discloses a PWM inverter that, when an on-off time of a PWM signal is calculated for each cycle of PWM control, calculates the on-off time by dropping a remainder of division in which the voltage command value is a dividend and outputs a PWM pulse based on the calculation result. The remainder from the above calculation corresponds to the voltage command value that is dropped instead of being reflected on the on-off time.

This PWM inverter adds the dropped remainder to the voltage command value calculated in the next cycle so that the remainder that is not reflected on the on-off time in the previous operation is reflected in a new on-off time in the next operation. Then again, a remainder at this time is to be reflected in the next operation. The process is repeated in this way. As a result, an average value of the on-off time set in the PWM signal generating unit can get close to the target on-off time that should have been set. To be more specific, the minimum unit of the value to be set in the generating unit can be made smaller than the actual minimum unit on average.

On the other hand, another problem related to the PWM control is noise resulting from the fixed PWM cycle. To reduce such noise, PWM control by frequency diffusion has been proposed. This frequency-diffusion PWM control reduces the occurrence of noise by randomly varying the PWM cycle. For example, Japanese Unexamined Application Publication No. 2010-130850 discloses a technology related to the frequency-diffusion PWM control.

However, a technology achieved by combining the time-sharing control method as disclosed in Japanese Unexamined Application Publication No. 3-98470 by which the minimum unit of the value set in the generating unit is made substantially smaller than the actual minimum unit with the method for reducing noise by frequency diffusion as disclosed in Japanese Unexamined Application Publication No. 2010-130850 has not been proposed. For this reason, the conventional technology cannot benefit from the advantages of these two methods at the same time. Even if the time-sharing control technology disclosed in Japanese Unexamined Application Publication No. 3-98470 is combined with the frequency diffusion technology disclosed in Japanese Unexamined Application Publication No. 2010-130850, the respective effects may not be fully achieved if the methods are combined with no consideration for influences the methods have on each other. For example, suppose that a duty ratio is adjusted by the time-sharing control as disclosed in Japanese Unexamined Application Publication No. 3-98470. In this case, if this method is simply combined with the frequency-diffusion technology, the attempt to finely adjust the duty ratio through the time-sharing control results in random variations in the cycle. Thus, a desired duty ratio cannot be set as intended, and the effects of the time-sharing control cannot be fully achieved.

The present disclosure is conceived in view of the circumstances described above, and it is an object of the present disclosure to provide a technology that allows the PWM signal cycle to vary and also fully achieves the effect of making a minimum unit of an ON time set in a PWM signal generating unit substantially smaller than an actual minimum unit.

SUMMARY

A signal generating circuit according to the present disclosure is included in a control device that includes: a control target unit in which an output voltage is converted by controlling an on-off operation of a switch with a PWM signal; and a feedback operation unit which sets an amount of operation on the basis of an output from the control target unit. The signal generating circuit generates the PWM signal to be applied to the control target unit and includes: a cycle setting unit which sets a cycle value of the PWM signal and periodically vary the set cycle value; a first determining unit which determines a first ON time on the basis of a first duty ratio and the set cycle value set by the cycle setting unit, the first duty ratio obtained by correction with a correction value set on the basis of a ratio between a target ON time set as the amount of operation by the feedback operation unit and a reference cycle that has a predetermined fixed value; a second determining unit which determines, as a second ON time, a setting candidate value that is close to the first ON time, in accordance with a resolution of a settable ON time; a generating unit which generates the PWM signal having: the set cycle value set by the cycle setting unit as a cycle of the PWM signal; and the second ON time determined by the second determining unit as an ON time of the PWM signal; and a third determining unit which determines the correction value that is to be used next time by the first determining unit, on the basis of the target ON time, the reference cycle, and the correction value of a previous time that are used for determining the first ON time; the set cycle value set by the cycle setting unit; and the second ON time determined by the second determining unit.

Advantageous Effects of Disclosure

The signal generating circuit described above includes the cycle setting unit that sets the cycle value of the PWM signal. The cycle setting unit has the function of varying the set cycle value. With this, the set cycle can vary instead of being fixed, which in turn can vary the cycle of the PWM signal to be outputted. Thus, noise resulting from the fixed cycle can be reduced.

Moreover, the first determining unit is provided. The first determining unit determines the first ON time on the basis of the first duty ratio obtained by correction with the correction value set on the basis of the target ON time set as the amount of operation by the feedback operation unit and the reference cycle which is the predetermined fixed value; and the set cycle value set by the cycle setting unit. The first duty ratio is obtained by correcting, with the set correction value (the correction value determined through operation performed the previous time by the third determining unit), the ratio between the target ON time set as the amount of operation by the feedback operation unit and the reference cycle which is the fixed value. Suppose that the cycle of the PWM signal is the reference cycle. In this case, the first duty ratio is an ideal duty ratio reflecting the time that was not reflected in the ON time of the previous PWM signal. By obtaining the first duty ratio described above and the present cycle (the set cycle value set by the cycle setting unit), the first ON time can be set as the ideal ON time that is to be set for the present set cycle. To be more specific, even if the cycle varies, the ideal ON time (the first ON time) can be obtained that appropriately reflects the time that was not reflected in the ON time of the previous PWM signal with respect to the target ON time set as the amount of operation.

Furthermore, the second determining unit is provided. The second determining unit is configured to determine, as the second ON time, the setting candidate value that is close to the first ON time in accordance with the resolution of the settable ON time. In this way, the actual ON time (the second ON time) close to the ideal ON time (the first ON time) can be set. Thus, the generating unit can generate the PWM signal having the set cycle value set by the cycle setting unit as the cycle of the PWM signal and the second ON time determined by the second determining unit as the ON time of the PWM signal.

When the generating unit generates the PWM signal having the second ON time ty2, a time that is not reflected in the actual ON time (the second ON time) remains out of the ideal ON time (the first ON time) that should have been set. To address this, the third determining unit determines the correction value that is to be used next time by the first determining unit, on the basis of the target ON time used for determining the first ON time, the reference cycle, the correction value of the previous time, the set cycle value set by the cycle setting unit, and the second ON time determined by the second determining unit. In doing so, the third determining unit can determine the correction value that is to be used next time by the first determining unit, the correction value reflecting the time that was not reflected in the actual ON time (the second ON time) of the PWM signal generated by the generating unit. Thus, in accordance with variations in the cycle, the first determining unit can obtain, in the next determining process, the ideal ON time (the first ON time) that appropriately reflects the time, which was not reflected, on the target ON time that is set as a new amount of operation.

By the repetition of these determining processes (by the first, second, and third determining units), the benefit from the effect of noise reduction by varying the cycle can be attained and the minimum unit of the ON time set in the generating unit can be made substantially smaller than the actual minimum unit.

DETAILED DESCRIPTION OF PREFERRED EMBODIMENTS

Figure 1:
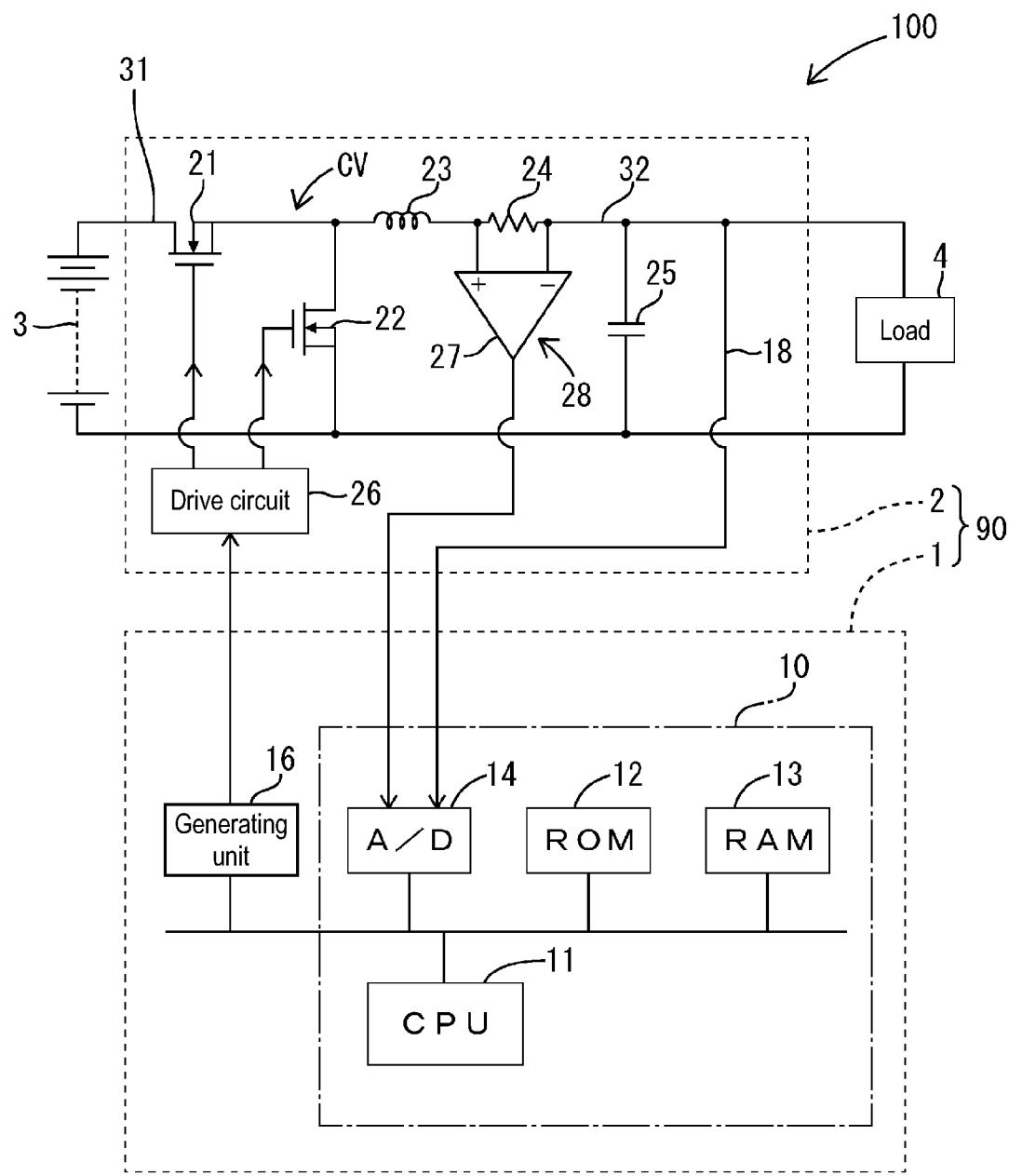
FIG. 1 is a schematic circuit diagram showing an example of a vehicle-mounted power supply system including a signal generating circuit and a voltage converting device according to Embodiment 1.

The following describes examples of preferred embodiments according to the disclosure.

In the description according to the present disclosure, the expression "the resolution of the settable ON time" refers to the fineness of the ON time which a signal generating circuit can vary. When the resolution is large, a minimum unit of the ON time which a generating unit can vary is large. Conversely, when the resolution is small, the minimum unit of the ON time which the generating unit can vary is small. In the description according to the present disclosure, the expression "determine, as the second ON time ty2, the setting candidate value that is close to the first ON time ty1 in accordance with the resolution of the settable ON time" means that an ON time close to the first ON time is selected from among ON times outputable by the generating unit (the ON times that can be switched in accordance with the resolution). For example, a method for "determining the setting candidate value close to the first ON time as the second ON time in accordance with the resolution of the settable ON time" may be achieved by a configuration in which the setting candidate value close to the first ON time is selected, as the second ON time, from among a plurality of setting candidate values which are the values of ON times outputable by the generating unit (for example, the plurality of predetermined setting candidate values which are values of settable ON times).

The cycle setting unit may vary the set cycle value for each cycle of the PWM signal. The first determining unit may determine, for each cycle of the PWM signal, the first ON time on the basis of the latest first duty ratio and the set cycle value most recently (i.e. the latest) set by the cycle setting unit, the latest first duty ratio obtained by correcting, with the latest correction value determined by the third determining unit, the ratio between the target ON time most recently set by the feedback operation unit and the reference cycle. The second determining unit may determine, for each cycle of the PWM signal, the setting candidate value that is close to the latest first ON time determined by the first determining unit, as the second ON time, from among a plurality of the setting candidate values which are ON times outputable by the generating unit. The generating unit may generate, for each cycle of the PWM signal, the PWM signal having; the set cycle value most recently set by the cycle setting unit as the cycle of the PWM signal; and the latest second ON time determined by the second determining unit as the ON time of the PWM signal. The third determining unit may determine, for each cycle of the PWM signal, the correction value that is to be used next time by the first determining unit, on the basis of the latest target ON time set by the feedback operation unit, the reference cycle, the latest correction value set previous time, the set cycle value most recently set by the cycle setting unit, and the latest second ON time determined by the second determining unit.

The signal generating circuit having the above configuration can vary the cycle at least for each cycle. Thus, the effect of noise reduction can be enhanced by finely varying the cycle. Furthermore, the ideal ON time (the first ON time) appropriately reflecting the time that was not reflected in the ON time of the previous PWM signal can be obtained for each cycle, appropriately corresponding to the variations for each cycle. Then, the PWM signal for which the actual ON time (the second ON time) close to the ideal ON time (the first ON time) is set can be generated for each cycle. In this way, the cycle can vary finely for each cycle, and the ON time of the PWM signal can be more finely controlled.

The first determining unit may determine, for each cycle of the PWM signal, the first ON time by multiplying the first duty ratio by the set cycle value most recently set by the cycle setting unit, the first duty ratio obtained by adding a value obtained by dividing the latest target ON time set by the feedback operation unit by the reference cycle to the latest correction value determined by the third determining unit. The second determining unit may determine, for each cycle of the PWM signal, the setting candidate value, as the second ON time, that is one of closest to and not less than the latest first ON time determined by the first determining unit; and closest to and not more than the latest first ON time determined by the first determining unit, from among the plurality of the setting candidate values. The third determining unit may, for each cycle of the PWM signal, calculate a duty ratio difference by subtracting, from the first duty ratio, a second duty ratio obtained by dividing the latest second ON time determined by the second determining unit by the set cycle value most recently set by the cycle setting unit and determine the calculated duty ratio difference as the correction value that is to be used next time by the first determining unit.

The signal generating circuit having the above configuration can obtain, for each cycle, the ideal ON time (the first ON time) that corresponds to the variations in the cycle and more accurately reflects the time that was not reflected in the ON time of the previous PWM signal. Moreover, the signal generating circuit can appropriately set, for each cycle, the actual ON time (the second ON time) that is close to the first ON time obtained for each cycle. Furthermore, the signal generating circuit can reflect the time that is not reflected in the actual ON time (the second ON time) set for each cycle, as the correction value with higher accuracy, on the determining process performed in the next cycle by the first determining unit.

A power supply device may include: a voltage converting device functioning as the control target unit that steps up or down a voltage inputted to one of conductive paths and outputs the stepped-up or-down voltage to the other of the conductive paths; the feedback operation unit which sets the amount of operation on the basis of an output from the voltage converting device; and the signal generating circuit described above.

This configuration can implement the power supply device capable of varying the PWM signal cycle to benefit from the effect of noise reduction and also fully achieving the effect of making the minimum unit of the ON time set in the generating unit substantially smaller than the actual minimum unit.

Embodiment 1

Hereinafter, Embodiment 1 embodying the present disclosure is described.

A vehicle-mounted power supply system 100 shown in FIG. 1 is provided mainly with: a power supply device 90 including a signal generating circuit 1 and a voltage converting device 2; a battery 3 as a power supply unit; and a load 4 as a target of power supply. The vehicle-mounted power supply system 100 supplies power to the vehicle-mounted load 4 according to power from the battery 3.

The battery 3 is made up of a well-known type of electrical storage means, such as a lead-acid storage battery, and generates a predetermined voltage. A high-potential terminal of the battery 3 is electrically connected to a first conductive path 31, and a low-potential terminal of the battery 3 is electrically connected to, for example, the ground.

The voltage converting device 2 is connected to the battery 3 and the load 4 which are externally provided, and has a function of stepping down a direct-current voltage supplied from the battery 3 and supplying the stepped-down voltage to the load 4. The voltage converting device 2 includes: a converter CV that steps down a direct-current voltage; a drive circuit 26 that drives the converter CV; a capacitor 25 that smooths out the voltage stepped down by the converter CV; and a current detecting circuit 28 that detects an output current. An output current from the converter CV is supplied to the load 4 via the current detecting circuit 28, and a voltage supplied to the load 4 is supplied to the signal generating circuit 1.

The converter CV is a so-called single-phase converter and interposed between the first conductive path 31 and the second conductive path 32. The converter CV includes: a high-side switching element 21 (a switch) which is an N-channel MOSFET having a drain supplied with the direct-current voltage from the battery 3; an inductor 23 having one end connected to the capacitor 25 and the other end connected to a source of the switching element 21; and a low-side switching element 22 (a switch) which is an N-channel MOSFET having a source grounded and a drain connected to a connection point between the switching element 21 and the inductor 23.

The drain of the high-side switching element 21 is connected to the first conductive path 31 that is an input-side conductive path. The source of the high-side switching element 21 is connected to the drain of the low-side switching element 22 and the one end of the inductor 23. An actuating signal (an ON signal) and a non-actuating signal (an OFF signal) are inputted from the drive circuit 26 into a gate of the switching element 21. In response to the signal from the drive circuit 26, the switching element 21 switches between an ON state and an OFF state. Similarly, the actuating signal (the ON signal) and the non-actuating signal (the OFF signal) are inputted from the drive circuit 26 into a gate of the switching element 22. In response to the signal from the drive circuit 26, the switching element 22 switches between the ON state and the OFF state.

The drive circuit 26 applies the ON signal to the gates of the switching elements 21 and 22 to alternately turn on the switching elements 21 and 22 in the respective control cycles, on the basis of the PWM signal supplied by a generating unit 16. The ON signal applied to the gate of the switching element 21 is substantially reversed in phase with respect to the ON signal applied to the gate of the switching element 22, and so-called dead time is provided for this ON signal.

The signal generating circuit 1 outputs the PWM signal to the voltage converting device 2 which is a control target unit. On the basis of a set target value (a target ON time), the signal generating circuit 1 selects, from among predetermined settable values, the ON time of the PWM signal to be outputted to the voltage converting device 2 and sets the selected value. The signal generating circuit 1 is described in detail later.

A control unit 10 includes a microcomputer having a CPU 11. The CPU 11 is connected, via buses, to: a ROM 12 that stores information, such as a program; a RAM 13 that stores information produced temporarily; and an A/D converter 14 that converts an analog voltage into a digital value. The CPU 11 is further connected to the generating unit 16 via a bus. A detection voltage from the current detecting unit 28 and the output voltage to be supplied to the load 4 are supplied to the A/D converter 14. In the present configuration, the current detecting circuit 28 and a path 18 that inputs the voltage to the A/D converter 14 make up an output detecting unit, which functions to detect the output current and the output voltage from the converter CV (a voltage converting unit). Here, in the example shown in FIG. 1, the path 18 is configured to input the voltage of the output-side second conductive path 32 to the A/D converter 14. However, the voltage of the second conductive path 32 may be divided and then the divided voltage may be inputted to the A/D converter 14.

The generating unit 16 is configured as a well-known type of PWM signal generating circuit and generates the PWM signal having a cycle and an ON time set by the control unit 10. The generating unit 16 includes an internal clock (not shown) for example, and generates the PWM signal having the ON time equal to an integral multiple of a cycle of the internal clock. The PWM signal generated by the generating unit 16 is supplied to the drive circuit 26.

The current detecting circuit 28 includes a resistor 24 and a differential amplifier 27. A voltage drop caused at the resistor 24 due to the output current from the converter CV is amplified by the differential amplifier 27 to become a detection voltage corresponding to the output current. Then, the detection voltage is converted into a digital value by the A/D converter 14.

The voltage converting device 2 having the above configuration functions as a synchronous rectifying step-down converter. The voltage converting device 2 switches the low-side switching element 22 between an ON operation and an OFF operation in synchronization with operation of the high-side switching element 21. With this, the voltage converting device 2 steps down the direct-current voltage applied to the first conductive path 31 and then outputs the stepped-down voltage to the second conductive path 32. To be more specific, the switching elements 21 and 22 are switched between a first state and a second state. In the first state, the switching element 21 and the switching element 22 are brought into the ON state and the OFF state, respectively, by the PWM signals applied to the gates of the switching elements 21 and 22 from the drive circuit 26 in a complementary manner. In the second state, the switching element 21 and the switching element 22 are brought into the OFF state and the ON state, respectively, by the PWM signals applied to the gates of the switching elements 21 and 22 from the drive circuit 26 in the complementary manner. The state alternates between the first and second states, with dead time being set. With this operation, the direct-current voltage applied to the first conductive path 31 is stepped down, and the stepped-down voltage is outputted to the second conductive path 32. The output voltage of the second conductive path 32 is determined according to a duty ratio of the PWM signal applied to the gate of the switching element 21.

Next, the signal generating circuit 1 is described in detail.

The signal generating unit 1 is included in the power supply device 90 (a control device) that includes: the voltage converting device 2 (the control target unit) in which output is controlled with the PWM signal; and a feedback operation unit which sets the amount of operation on the basis of the output from the voltage converting device 2. The signal generating circuit 1 generates the PWM signal to be supplied to the voltage converting device 2.

Figure 2:
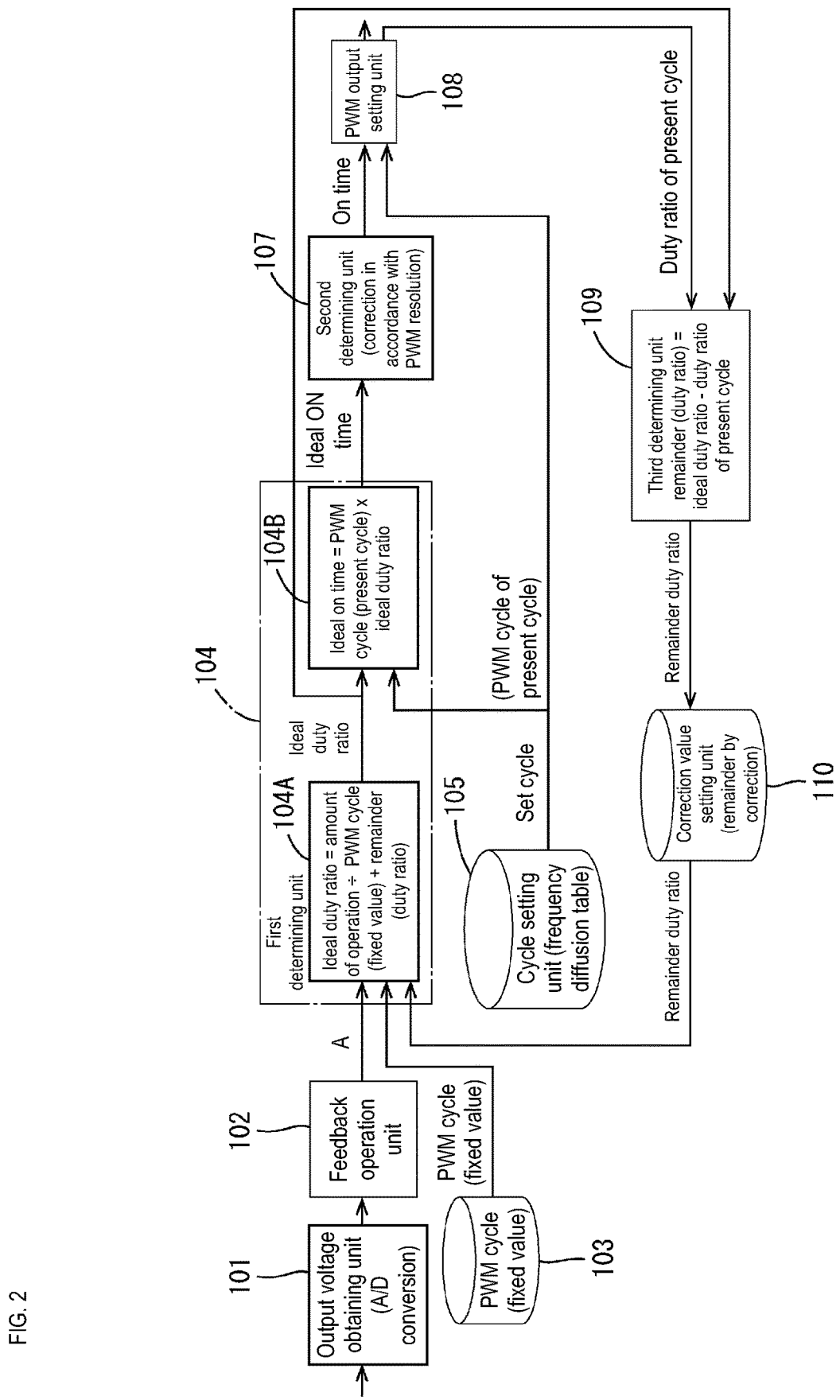
FIG. 2 is a schematic functional block diagram showing functions of the signal generating circuit according to Embodiment 1.
Figure 3:
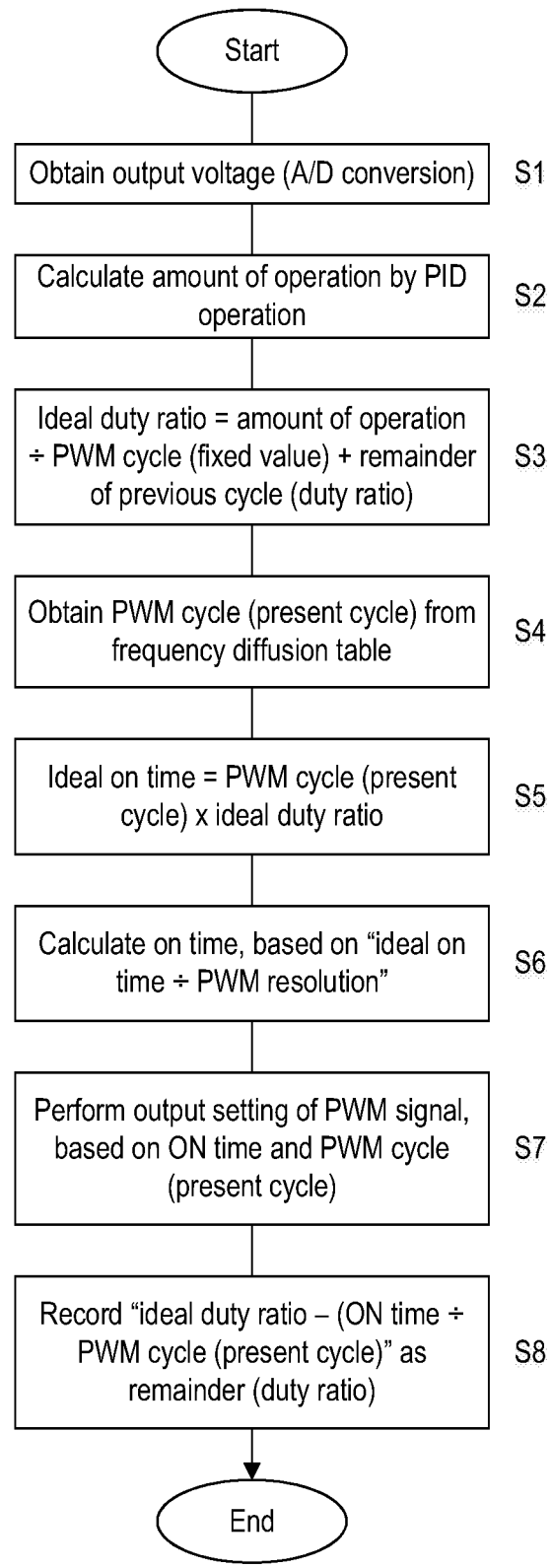
FIG. 3 is a flowchart showing an example of control performed by the signal generating circuit according to Embodiment 1.

The control unit 10 of the signal generating circuit 1 has functions as shown in FIG. 2, and performs arithmetic control according to the flowchart shown in FIG. 3. The arithmetic control shown in FIG. 3 is performed by the control unit 10 for each cycle of the PWM signal.

As shown in FIG. 3, when the control shown in FIG. 3 is performed for each cycle of the PWM signal, the output voltage applied to the output-side conductive path (the second conductive path 32) of the voltage converting device 2 is obtained in Step S1. A function of an output voltage obtaining unit 101 shown in FIG. 2 is performed by the A/D converter 14 and the CPU 11 in particular, and the voltage (the output voltage) applied to the second conductive path 32 is thus obtained. This output voltage is temporarily held in a storage unit in the control unit 10.

After obtaining the voltage (the output voltage) applied to the second conductive path 32 in Step S1 of FIG. 3, the control unit 10 performs a process of Step S2. On the basis of an output voltage V2 obtained in Step S1 and a predetermined target voltage Vt, the control unit 10 calculates the amount of operation by a well-known feedback operation method. A function of a feedback operation unit (a PID operation unit) 102 (see FIG. 2) that executes the process of Step S2 is performed by the CPU 11 in particular. The CPU 11 functions as the feedback operation unit that sets the amount of operation on the basis of the output from the voltage converting device 2. In the present example, the output voltage corresponds to the amount of control performed through the PID control, and the ON time corresponds to the amount of operation performed through the PID control. To be more specific, on the basis of a deviation between the output voltage V2 applied to the second conductive path 32 and the predetermined target voltage Vt, the feedback operation is performed according to the well-known PID operation method. Then, the ON time that is to be a target used in the next cycle (a target ON time ta) is set as the amount of operation. Here, the method for setting a proportional gain, a differential gain, and an integral gain used for the feedback operation according to the PID method is not intended to be limiting, and these gains may be set by various methods.

After Step S2, the control unit 10 performs a process of Step S3. A function of an ideal duty ratio calculating unit 104A (see FIG. 2) that executes the process of Step S3 can be performed by the CPU 11. In Step S3, the ideal duty ratio calculating unit 104A calculates, for each cycle of the PWM signal, a first duty ratio D1 (an ideal duty ratio) by adding a value obtained by dividing a latest target ON time ta set by the feedback operation unit 102 by a reference cycle Tb to a latest correction value Da (a remainder of a previous cycle) determined by a third determining unit 109. More specifically, this calculation is expressed as "D1=ta/Tb+Da".

After Step S3, the control unit 10 performs a process of Step S4. A function of a cycle setting unit 105 that executes the process of Step S4 can be performed by the CPU 11 and the ROM 12. A plurality of cycles that are settable in the generating unit 16 and are within a predetermined cycle range are prepared as candidates in the cycle setting unit 105. The cycle setting unit 105 randomly selects one of these cycles. For example, the ROM 12 stores, as a data table (a frequency diffusion table), the plurality of cycles that are settable in the generating unit 16 and are within the predetermined cycle range. Then, the CPU 11 randomly selects one of the cycles from the frequency diffusion table in the process of Step S4 performed for each cycle. A cycle value Ts of the selected cycle is held as the present cycle (the current cycle) in the storage unit. In this way, the cycle setting unit 105 has a function of setting the cycle value Ts of the PWM signal. In addition, the cycle setting unit 105 also functions to vary the cycle value Ts with time, or more specifically, vary the cycle value Ts for each cycle of the PWM signal.

After Step S4, the control unit 10 performs a process of Step S5. A function of an ideal ON time calculating unit 104B that executes the process of Step S5 can be performed by the CPU 11. The ideal ON time calculating unit 104B performs the process of Step S5 for each cycle of the PWM signal. By this process, the ideal ON time calculating unit 104B determines a first ON time ty1 (an ideal ON time) by multiplying the first duty ratio D1 by a latest cycle value Ts determined by the cycle setting unit 105, the first duty ratio D1 being obtained by adding the value obtained by dividing the latest target ON time ta set by the feedback operation unit 102 by the reference cycle Tb to the latest correction value Da (the remainder of the previous cycle) determined by the third determining unit 109. More specifically, this calculation is expressed as "ty1=Ts×D1".

In this way, the ideal duty ratio calculating unit 104A and the ideal ON time calculating unit 104B that function as a first determining unit 104 perform the processes of S3 and S5 for each cycle of the PWM signal. By these processes, the first ON time ty1 is determined on the basis of the latest first duty ratio D1 obtained by correcting, with the latest correction value Da determined by the third determining unit 109, the ratio between the latest target ON time ta set by the feedback operation unit 102 and the reference cycle Tb; and the latest cycle value Ts set by the cycle setting unit 105.

After Step S5, the control unit 10 performs a process of Step S6. By the process of Step S6, the control unit 10 determines a second ON time (an actual ON time) on the basis of the first ON time (the ideal ON time) and the PWM resolution. A function of a second determining unit 107 that executes the process of Step S6 can be performed by the CPU 11. The second determining unit 107 performs the process of Step S6 for each cycle of the PWM signal. By this process, the second determining unit 107 determines, as a second ON time ty2, a setting candidate value close to the latest first ON time ty1 determined by the first determining unit 104, from among the plurality of setting candidate values which are ON time values outputable by the generating unit 16. Here, the setting candidate value refers to a value of an integral multiple of the minimum unit (the minimum increment) to be reflected in the change in the PWM signal outputted by the generating unit 16. To be more specific, the ON time of the PWM signal outputted by the generating unit 16 is selected from among the aforementioned values of integral multiples of the minimum unit (from among the setting candidate values). More specifically, the second determining unit 107 determines, as the second ON time ty2, the setting candidate value that is closest to and not less than the latest first ON time ty1 determined by the first determining unit 104 or that is closest to and not more than the latest first ON time ty1 determined by the first determining unit 104, from among the predetermined setting candidate values.

After Step S6, the control unit 10 performs a process of Step S7. A function of a PWM output setting unit 108 (see FIG. 2) that executes the process of Step S7 can be performed by the CPU 11 and the RAM 13. In Step S7, the cycle value Ts set by the cycle setting unit 105 in Step S4 and the second ON time ty2 determined by the second determining unit 107 in Step S6 are held in a storage unit, such as the RAM 13. The generating unit 16 checks the cycle value Ts and the second ON time ty2 held in the storage unit for each cycle of the PWM signal. Then, the generating unit 16 generates, for each cycle of the PWM signal, the PWM signal having the cycle value Ts set by the cycle setting unit 105 as the signal cycle and the second ON time ty2 determined by the second determining unit 107 as the ON time.

After Step S7, the control unit 10 performs a process of Step S8. A function of the third determining unit 109 (see FIG. 2) that executes the process of Step S8 can be performed by the CPU 11. The third determining unit 109 performs the process of Step S8 for each cycle of the PWM signal. By this process, the third determining unit 109 determines the correction value Da that is to be used next time by the first determining unit 104, on the basis of the latest target ON time to set by the feedback operation unit 102, the reference cycle Tb, the latest correction value Da set in Step S8 of the previous cycle, the latest cycle value Ts set by the cycle setting unit 105, and the latest second ON time ty2 determined by the second determining unit 107.

To be more specific, the third determining unit 109 performs the operation of Step S8 for each cycle of the PWM signal. By this process, the third determining unit 109 calculates a duty ratio difference (a remainder) by subtracting, from the first duty ratio D1 (the ideal duty ratio), the second duty ratio D2 (the duty ratio of the present cycle) obtained by dividing the latest second ON time ty2 determined by the second determining unit 107 by the latest cycle value Ts set by the cycle setting unit 105. Then, the third determining unit 109 sets the calculated duty ratio difference (the remainder) as the correction value Da that is to be used by the first determining unit 104 in the next cycle. More specifically, this calculation is expressed as "Da=D1−D2, where D2=ty2/Ts". The correction value (the remainder) Da obtained in this way is held in a storage unit (such as the RAM 13) functioning as a correction value setting unit 110 (see FIG. 2), and is used by the first determining unit 104 in the next cycle.

Hereinafter, examples of advantageous effects according to the present configuration are described.

The signal generating circuit 1 in the present configuration includes the cycle setting unit that sets the cycle value Ts of the PWM signal. The cycle setting unit has the function of periodically varying the set cycle value Ts. With this, the set cycle of the PWM signal can vary instead of being fixed, which in turn can vary the cycle of the PWM signal to be outputted. Thus, noise resulting from the fixed cycle can be reduced.

Moreover, the first determining unit 104 is provided. The first determining unit 104 determines the first ON time ty1 on the basis of the first duty ratio D1 obtained by correcting, with the correction value set according to a predetermined method, the ratio between the target ON time ta set as the amount of operation by the feedback operation unit 102 and the reference cycle Tb which is a predetermined fixed value; and the set cycle value Ts set by the cycle setting unit 105. The first duty ratio D1 is obtained by correcting, with the set correction value (the correction value determined through operation performed the previous time by the third determining unit 109), the ratio between the target ON time ta set as the amount of operation by the feedback operation unit 102 and the reference cycle Tb which is the fixed value. Suppose that the cycle of the PWM signal is the reference cycle Tb. In this case, the first duty ratio D1 is an ideal duty ratio reflecting the time that was not reflected in the ON time of the previous PWM signal. By obtaining the first duty ratio D1 described above and the present set cycle (the set cycle value Ts set by the cycle setting unit 105), the first ON time ty1 can be set as the ideal ON time that is to be set for the present set cycle Ts. To be more specific, even if the cycle varies, the ideal ON time (the first ON time ty1) can be obtained that appropriately reflects the time that was not reflected in the ON time of the previous PWM signal with respect to the target ON time ta set as the amount of operation.

Furthermore, the second determining unit 107 is provided. The second determining unit 107 is configured to determine, as the second ON time ty2, the setting candidate value that is close to the first ON time ty1 in accordance with the resolution of the settable ON time. In this way, the actual ON time (the second ON time ty2) close to the ideal ON time (the first ON time ty1) can be set. Thus, the generating unit 16 can generate the PWM signal having the set cycle value Ts set by the cycle setting unit 105 as the cycle of the PWM signal and the second ON time ty2 determined by the second determining unit 107 as the ON time of the PWM signal.

When the generating unit 16 generates the PWM signal having the second ON time ty2, a time that is not reflected in the actual ON time (the second ON time ty2) remains out of the ideal ON time (the first ON time ty1) that should have been set. To address this, the third determining unit 109 determines the correction value that is to be used next time by the first determining unit 104, on the basis of the target ON time ta that is to be used for determining the first ON time ty1, the reference cycle Tb, the correction value of the previous time, the set cycle value Ts set by the cycle setting unit 105, and the second ON time ty2 determined by the second determining unit 107. In doing so, the third determining unit 109 can determine the correction value that is to be used next time by the first determining unit 104, the correction value reflecting the time that was not reflected in the actual ON time (the second ON time ty2) of the PWM signal generated by the generating unit 16. Thus, in accordance with variations in the cycle, the first determining unit 104 can obtain, in the next determining process, the ideal ON time (the first ON time ty1) that appropriately reflects the time, which was not reflected, on the target ON time ta that is set as a new amount of operation.

By the repetition of these determining processes (by the first, second, and third determining units), the benefit from the effect of noise reduction by varying the cycle can be received and the minimum unit of the ON time set in the generating unit can be made substantially smaller than the actual minimum unit.

Moreover, the signal generating circuit 1 in the present configuration can vary the cycle at least for each cycle. Thus, the effect of noise reduction can be enhanced by finely varying the cycle. Furthermore, the ideal ON time (the first ON time ty1) appropriately reflecting the time that was not reflected in the ON time of the previous PWM signal can be obtained for each cycle, appropriately corresponding to the variations for each cycle. Then, the PWM signal for which the actual ON time (the second ON time ty2) close to the ideal ON time (the first ON time ty1) is set can be generated for each cycle. In this way, the cycle can vary finely for each cycle, and the ON time of the PWM signal can be more finely controlled.

Figure 4:
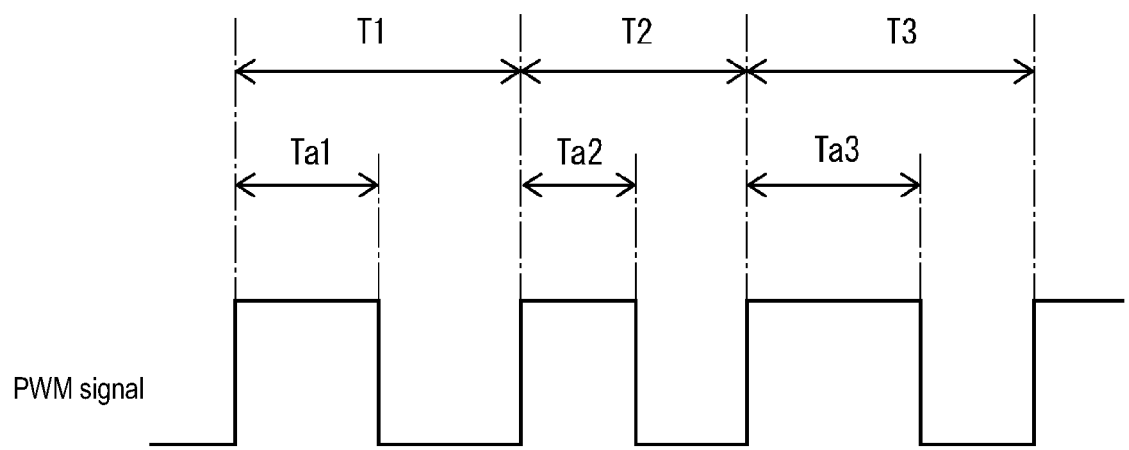
FIG. 4 is a diagram illustrating an example of a PWM signal generated by the signal generating circuit according to Embodiment 1.

For example, as shown in FIG. 4, the cycle setting unit 105 can vary the cycle values (T1, T2, and T3 in FIG. 4) of the PWM signal by changing the setting for each cycle. The effect of noise reduction can be further enhanced by fine control over the cycle variation. Each of ON times Ta1, Ta2, and Ta3 of the cycles T1, T2, and T3 is set in order to reflect the time that was not reflected in the previous cycle. Thus, an advantage of the time-sharing control can be fully utilized.

According to the present configuration, the first determining unit 104 determines, for each cycle of the PWM signal, the first ON time ty1 (the ideal ON time) by multiplying the first duty ratio D1 (the ideal duty ratio) by the latest set cycle value Ts (the value of the present cycle) determined by the cycle setting unit 105, the first duty ratio D1 being obtained by adding the value obtained by dividing the latest target ON time to set by the feedback operation unit 102 by the reference cycle Tb to the latest correction value (the remainder of the previous cycle) determined by the third determining unit 109. The second determining unit 107 determines, for each cycle of the PWM signal, the setting candidate value that is closest to and not less than the latest first ON time ty1 (the ideal ON time) determined by the first determining unit 104 or that is closest to and not more than the latest first ON time ty1 (the ideal ON time) determined by the first determining unit 104, as the second ON time ty2 (the actual ON time), from among the plurality of setting candidate values. The third determining unit 109 calculates, for each cycle of the PWM signal, the duty ratio difference (the remainder) by subtracting, from the first duty ratio D1 (the ideal duty ratio), the second duty ratio D2 (the duty ratio of the present cycle) obtained by dividing the latest second ON time ty2 (the actual ON time) determined by the second determining unit 107 by the latest cycle value Ts (the value of the present cycle) set by the cycle setting unit 105. Then, the third determining unit 109 sets the calculated duty ratio difference (the remainder) as the correction value that is to be used next time by the first determining unit 104.

The signal generating circuit 1 having the above configuration can obtain, for each cycle, the ideal ON time (the first ON time ty1) that corresponds to the variations in the cycle and more accurately reflects the time that was not reflected in the ON time of the previous PWM signal. Moreover, the signal generating circuit 1 can appropriately set, for each cycle, the actual ON time (the second ON time ty2) that is closer to the first ON time ty1 obtained for each cycle. Furthermore, the signal generating circuit 1 can reflect the time that is not reflected in the actual ON time (the second ON time ty2) set for each cycle, as the correction value with higher accuracy, on the determining process performed in the next cycle by the first determining unit 104.

The power supply device 90 described above includes: the voltage converting device 2, as the control target unit, that steps down the voltage inputted to the first conductive path 31 (one of the conductive paths) and outputs the stepped-down voltage to the second conductive path 32 (the other of the conductive paths); the feedback operation unit that sets the amount of operation on the basis of the output from the voltage converting device 2; and the signal generating circuit 1 described above. This configuration can implement the power supply device 90 capable of varying the cycle of the PWM signal to benefit from the effect of noise reduction and also fully achieving the effect of making the minimum unit of the ON time set in the generating unit 16 substantially smaller than the actual minimum unit.

Other Embodiments

The present disclosure is not limited to the embodiment according to the above description presented with reference to the drawings. For example, the following embodiments are also included in the technical scope according to the present disclosure.

In Embodiment 1, a step-down DCDC converter is described as an example of the voltage converting device. However, in Embodiment 1 or any exemplary case in which Embodiment 1 is modified, any voltage converting device that performs control using the PWM signal can be applied. Instead of the step-down DCDC converter, a step-up DCDC converter or a step up-down DCDC converter may also be applied. Moreover, the voltage converting device may also be a unidirectional DCDC converter having the input and output sides fixed, or may be a bidirectional DCDC converter.

In Embodiment 1, the single-phase DCDC converter is described as an example. However, in Embodiment 1 or any exemplary case in which Embodiment 1 is modified, a multiphase DCDC converter may be used.

In Embodiment 1, the synchronous rectifying DCDC converter is described as an example. However, in Embodiment 1 or any exemplary case in which Embodiment 1 is modified, a diode DCDC converter in which some of switching elements are replaced by diodes may be used.

In Embodiment 1, the switching elements 21 and 22 that are the N-channel MOSFETs are described as examples of the switching elements included in the voltage converting circuit. However, in Embodiment 1 or any exemplary case in which Embodiment 1 is modified, each of the switching elements may also be a P-channel MOSFET, or a different type of switching element such as a bipolar transistor.

Embodiment 1 describes an exemplary case where the feedback operation unit 102 functioning as the feedback operation unit performs the feedback operation according to the PID operation method on the basis of the deviation between the output voltage V2 applied to the second conductive path 32 and the predetermined target voltage Vt, and calculates, as the amount of operation, the ON time (the target ON time ta) as a target used in the next cycle. However, in Embodiment 1 or any exemplary case in which Embodiment 1 is modified, any feedback operation method can be applied that determines, on the basis of the output voltage V2 applied to the second conductive path 32 and the predetermined target voltage Vt, the target ON time ta such that the output voltage V2 gets close to the target voltage Vt. That is, various well-known feedback operation methods can be used.

In Embodiment 1, the second determining unit 107 determines, as the second ON time ty2, the setting candidate value that is closest to and not less than the latest first ON time ty1 determined by the first determining unit 104 or that is closest to and not more than the latest first ON time ty1 determined by the first determining unit 104, from among the plurality of setting candidate values. However, in Embodiment 1 or any exemplary case in which Embodiment 1 is modified, the setting candidate value that is closest to and not more than the latest first ON time ty1 determined by the first determining unit 104 may be set as the second ON time ty2 from among the plurality of setting candidate values. Alternatively, the setting candidate value that is closest to and not less than the latest first ON time ty1 determined by the first determining unit 104 may be set as the second ON time ty2 from among the plurality of setting candidate values.

The invention claimed is:

1. A signal generating circuit for a control device that includes: a control target unit in which an output voltage is converted by controlling an on-off operation of a switch with a PWM signal; and a feedback operation unit which sets an amount of operation on the basis of an output from the control target unit, the signal generating circuit generating the PWM signal to be applied to the control target unit and comprising:
a cycle setting unit configured to set a cycle value of the PWM signal and periodically vary the set cycle value;
a first determining unit configured to determine a first ON time on the basis of a first duty ratio and the set cycle value set by the cycle setting unit, the first duty ratio obtained by correction with a correction value set on the basis of a ratio between a target ON time set as the amount of operation by the feedback operation unit and a reference cycle that has a predetermined fixed value;
a second determining unit configured to determine, as a second ON time, a setting candidate value that is close to the first ON time, in accordance with a resolution of a settable ON time;
a generating unit configured to generate the PWM signal having: the set cycle value set by the cycle setting unit as a cycle of the PWM signal; and the second ON time determined by the second determining unit as an ON time of the PWM signal; and
a third determining unit configured to determine the correction value that is to be used next time by the first determining unit, on the basis of: the target ON time, the reference cycle, and the correction value of a previous time that are used for determining the first ON time; the set cycle value set by the cycle setting unit; and the second ON time determined by the second determining unit.

2. The signal generating circuit according to claim 1,
wherein the cycle setting unit is configured to vary the set cycle value for each cycle of the PWM signal,
the first determining unit is configured to determine, for each cycle of the PWM signal, the first ON time on the basis of the latest first duty ratio and the set cycle value most recently set by the cycle setting unit, the latest first duty ratio obtained by correcting, with the latest correction value determined by the third determining unit, the ratio between the target ON time most recently set by the feedback operation unit and the reference cycle,
the second determining unit is configured to determine, for each cycle of the PWM signal, the setting candidate value that is close to the latest first ON time determined by the first determining unit, as the second ON time, from among a plurality of the setting candidate values which are ON times outputable by the generating unit, the generating unit is configured to generate, for each cycle of the PWM signal, the PWM signal having: the set cycle value most recently set by the cycle setting unit as the cycle of the PWM signal; and the latest second ON time determined by the second determining unit as the ON time of the PWM signal, and the third determining unit is configured to determine, for each cycle of the PWM signal, the correction value that is to be used next time by the first determining unit, on the basis of the latest target ON time set by the feedback operation unit, the reference cycle, the latest correction value set previous time, the set cycle value most recently set by the cycle setting unit, and the latest second ON time determined by the second determining unit.

3. The signal generating circuit according to claim 2, wherein the first determining unit is configured to determine, for each cycle of the PWM signal, the first ON time by multiplying the first duty ratio by the set cycle value most recently set by the cycle setting unit, the first duty ratio obtained by adding a value obtained by dividing the latest target ON time set by the feedback operation unit by the reference cycle to the latest correction value determined by the third determining unit, the second determining unit is configured to determine, for each cycle of the PWM signal, the setting candidate value, as the second ON time, that is one determining unit; and closest to and not more than the latest first ON time determined by the first determining unit, from among the plurality of the setting candidate values, and the third determining unit is configured to, for each cycle of the PWM signal, calculate a duty ratio difference by subtracting, from the first duty ratio, a second duty ratio obtained by dividing the latest second ON time determined by the second determining unit by the set cycle value most recently set by the cycle setting unit and determine the calculated duty ratio difference as the correction value that is to be used next time by the first determining unit.

4. A power supply device, comprising:
a voltage converting device functioning as the control target unit that steps up or down a voltage inputted to one of conductive paths and outputs the stepped-up or-down voltage to an other of the conductive paths;
the feedback operation unit configured to set the amount of operation on the basis of an output from the voltage converting device; and
the signal generating circuit according to claim 1.

5. A power supply device, comprising:
a voltage converting device functioning as the control target unit that steps up or down a voltage inputted to one of conductive paths and outputs the stepped-up or-down voltage to an other of the conductive paths;
the feedback operation unit configured to set the amount of operation on the basis of an output from the voltage converting device; and
the signal generating circuit according to claim 2.

6. A power supply device, comprising:
a voltage converting device functioning as the control target unit that steps up or down a voltage inputted to one of conductive paths and outputs the stepped-up or-down voltage to an other of the conductive paths;
the feedback operation unit configured to set the amount of operation on the basis of an output from the voltage converting device; and
the signal generating circuit according to claim 3.

* * * * *